(12) United States Patent
Neff et al.

(10) Patent No.: US 8,236,582 B2
(45) Date of Patent: Aug. 7, 2012

(54) CONTROLLING EDGE EMISSION IN PACKAGE-FREE LED DIE

(75) Inventors: James G. Neff, Felton, CA (US); Serge J. Bierhuizen, Santa Rosa, CA (US); John E. Epler, San Jose, CA (US)

(73) Assignees: Philips Lumileds Lighting Company, LLC, San Jose, CA (US); Koninklijke Philips Electronics N.V., Eindhoven (NL)

( * ) Notice: Subject to any disclaimer, the term of this patent is extended or adjusted under 35 U.S.C. 154(b) by 290 days.

(21) Appl. No.: 12/577,623

(22) Filed: Oct. 12, 2009

(65) Prior Publication Data

US 2010/0029023 A1     Feb. 4, 2010

Related U.S. Application Data

(63) Continuation-in-part of application No. 12/433,972, filed on May 1, 2009, now abandoned, and a continuation-in-part of application No. 12/178,902, filed on Jul. 24, 2008.

(51) Int. Cl.
    *H01L 21/00* (2006.01)
(52) U.S. Cl. ............. 438/22; 438/29; 438/24; 438/46; 438/47

(58) Field of Classification Search ............. 438/460, 438/15, 28, 22, 29, 24, 46, 47
See application file for complete search history.

(56) References Cited

U.S. PATENT DOCUMENTS

| 7,256,483 B2 | 8/2007 | Epier et al. |
| 7,361,938 B2 | 4/2008 | Mueller et al. |
| 2005/0062140 A1 | 3/2005 | Leung et al. |
| 2005/0167682 A1 | 8/2005 | Fukasawa |
| 2006/0197094 A1 | 9/2006 | Sugawara |
| 2007/0158669 A1* | 7/2007 | Lee et al. ............. 257/98 |
| 2008/0102541 A1 | 5/2008 | Kang et al. |
| 2008/0203410 A1* | 8/2008 | Brunner et al. ............. 257/98 |

FOREIGN PATENT DOCUMENTS

| EP | 1748499 A2 | 1/2007 |
| EP | 1995780 A1 | 11/2008 |
| WO | 2008096301 A1 | 8/2008 |

* cited by examiner

*Primary Examiner* — Chuong A. Luu (57) ABSTRACT

Light emitting diode (LED) structures are fabricated in wafer scale by mounting singulated LED dies on a carrier wafer or a stretch film, separating the LED dies to create spaces between the LED dies, applying a reflective coating over the LED dies and in the spaces between the LED dies, and separating or breaking the reflective coating in the spaces between the LED dies such that some reflective coating remains on the lateral sides of the LED die. Portions of the reflective coating on the lateral sides of the LED dies may help to control edge emission.

21 Claims, 6 Drawing Sheets

CONTROLLING EDGE EMISSION IN PACKAGE-FREE LED DIE

CROSS REFERENCE TO RELATED APPLICATION

This application is a continuation-in-part of U.S. patent Ser. No. 12/433,972, entitled "Controlling Edge Emission in Package-Free LED Die," filed on May 1, 2009, which is commonly assigned and incorporated herein by reference. This application is related to U.S. patent application Ser. No. 12/178,902, entitled "Semiconductor Light Emitting Device Including a Window Layer and a Light-Directing Structure," filed on Jul. 24, 2008, which is commonly assigned and incorporated herein by reference.

FIELD OF INVENTION

The present disclosure relates to light emitting diodes (LEDs) and, in particular, to package-free LED dies.

DESCRIPTION OF RELATED ART

Semiconductor LEDs are among the most efficient light sources currently available. Materials systems currently of interest in the manufacture of high-brightness light emitting devices capable of operation across the visible spectrum include Group III-V semiconductors; for example, binary, ternary, and quaternary alloys of gallium, aluminum, indium, nitrogen, phosphorus, and arsenic. III-V devices emit light across the visible spectrum. GaAs- and GaP-based devices are often used to emit light at longer wavelengths such as yellow through red, while III-nitride devices are often used to emit light at shorter wavelengths such as near-UV through green.

Gallium nitride LEDs typically use a transparent sapphire growth substrate due to the crystal structure of sapphire being similar to the crystal structure of gallium nitride.

Some GaN LEDs are formed as flip chips, with both electrodes on the same surface, where the LED electrodes are bonded to electrodes on a submount without using wire bonds. In such a case, light is transmitted through the transparent sapphire substrate, and the LED layers oppose the submount. A submount provides an interface between the LED and an external power supply. Electrodes on the submount bonded to the LED electrodes may extend beyond the LED or extend to the opposite side of the submount for wire bonding or surface mounting to a circuit board.

SUMMARY

In some embodiments of the present disclosure, light emitting diode (LED) dies on a device wafer are separated to create spaces between the LED dies, and a reflective coating is applied over the LED dies and in the spaces between the LED dies. When the LED dies are again separated, portions of the reflective coating remain on the lateral sides of the LED dies. The reflective coating on the lateral sides of the LED dies may control edge emission, improve color-over-angle uniformity, and improve brightness. The reflective coating may be a polymer or a resin with reflective particles, or a thin metal film.

BRIEF DESCRIPTION OF THE DRAWINGS

Use of the same reference numbers in different figures indicates similar or identical elements.

DETAILED DESCRIPTION

Figure 1:
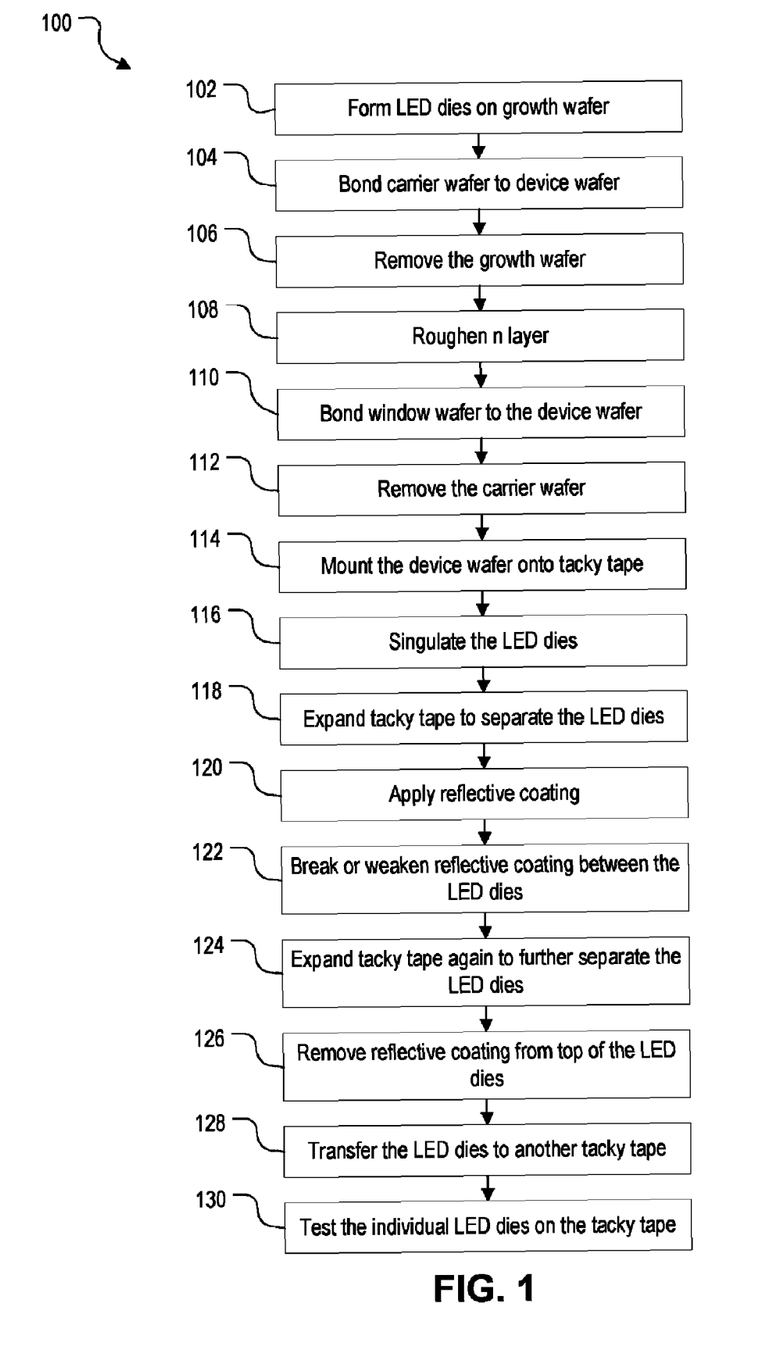
FIG. 1 is a flowchart of a method to fabricate light emitting diode (LED) structures in wafer scale using a reflective coating to control edge emission from LED dies.

FIG. 1 is a flowchart of a method 100 to fabricate light emitting diode (LED) structures in wafer scale using a reflective coating to control edge emission from LED dies in some embodiments of the present disclosure. Method 100 includes processes 102 to 130.

Figure 2:
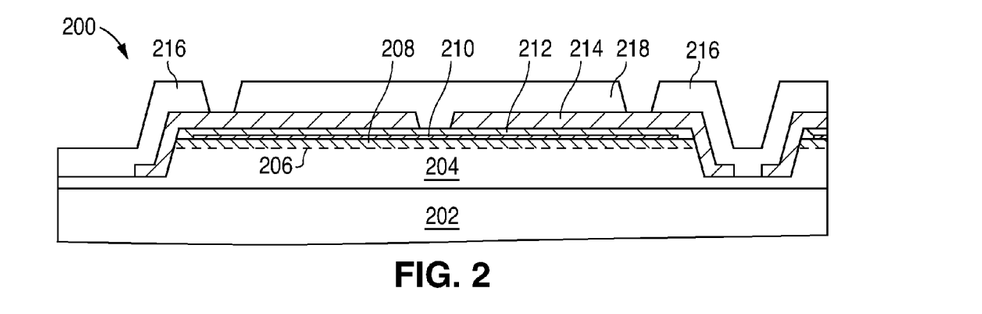
FIGS. 2 to 13 illustrate cross-sectional views of the processes in the method of FIG. 1 when the reflective coating is a polymer or a resin with reflective particles.

In process 102, example LED dies 200 are formed on a growth wafer. For simplicity, a single LED die 200 is illustrated in FIG. 2. LED die 200 includes a growth wafer 202, an n-type layer 204 epitaxially grown over the growth wafer, a light-emitting layer 206 (also common referred to as an "active layer") epitaxially grown over the n-type layer, a p-type layer 208 epitaxially grown over the light-emitting layer, a conductive reflective layer 210 formed over the p-type layer, and a guard metal layer 212 formed over the conductive reflective layer. A dielectric 214 is formed over the structures. Openings are formed in the various layers to provide access to n-type layer 204 and conductive reflective layer 210 for p-type layer 208. One or more n-type bond pads 216 are formed to electrically contact n-type layer 204, and one or more p-type bond pads 218 are formed to electrically contact conductive reflective layer 210. Instead of LED dies 200, method 100 may be applied to other types of LED dies or other light emitting devices that have edge emission. Process 102 is followed by process 104.

Figure 3:
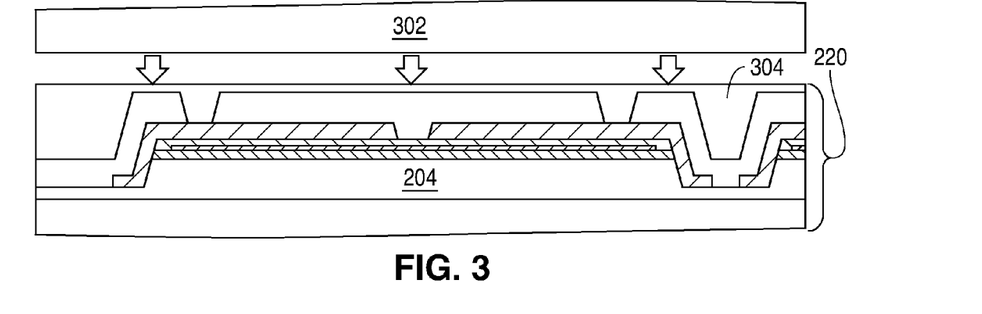

In process 104, a carrier wafer 302 is temporarily bonded to device wafer 220. Hereafter "device wafer 220" refers to the wafer scale structure including LED dies 200 in a process. A removable adhesive 304 is first applied over the top of device wafer 220 and carrier wafer 302 is then bonded to the top of the device wafer as shown in FIG. 3. Adhesive 304 may be a thermal, solvent, or light-exposure release adhesive. Removable adhesive 302 may be applied in a spin-on process, a wipe-on process, a spray process, or other suitable process. Process 104 is followed by process 106.

Figure 4:
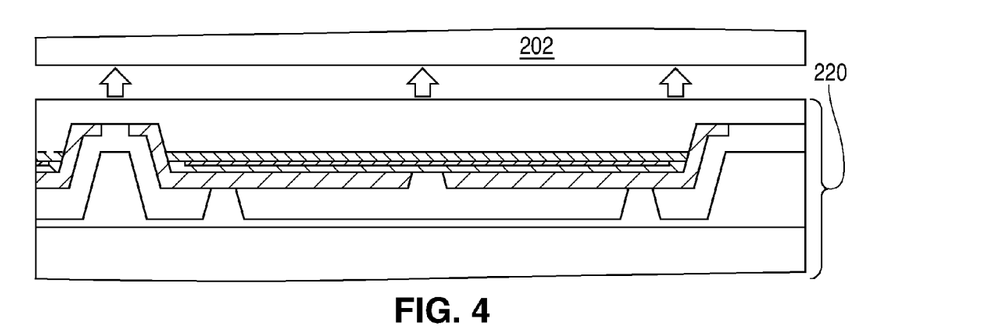

In process 106, device wafer 220 is flipped over and growth wafer 202 is removed as shown in FIG. 4. Growth wafer 202 may be removed by a laser lift-off process. Process 106 is followed by process 108.

Figure 5:
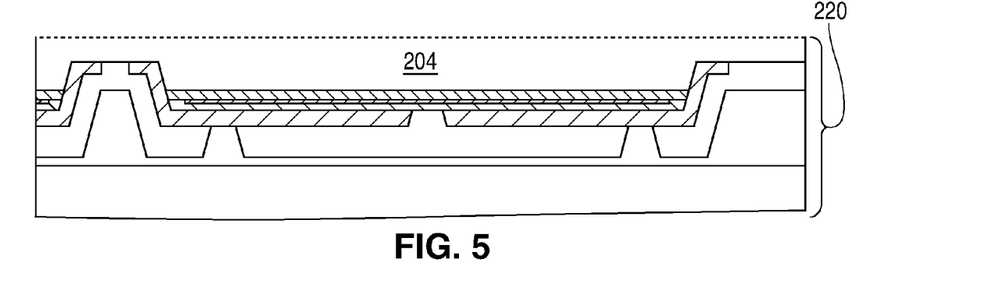

In process 108, n-type layer 204 is roughened to improve light extraction as shown in FIG. 5. N-type layer 204 may be roughened in a physical process (e.g., grinding or lapping) or a chemical process (e.g., etching). For example, n-type layer 204 may be roughened by photoelectrochemical etching. Process 108 is followed by process 110.

Figure 6:
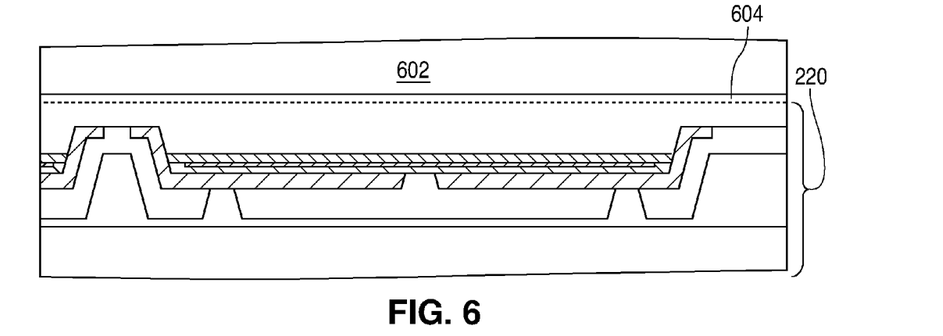

In process 110, a window wafer 602 is bonded to device wafer 220 as shown in FIG. 6. A transparent adhesive 604 is first applied over the top of device wafer 220 and window wafer 602 is then bonded to the top of the device wafer.

Transparent adhesive 604 may be silicone, epoxy, or other suitable material. Transparent adhesive 604 may be applied by a spin-on, wipe-on, spray, or other suitable process. Transparent adhesive 604 may have a refractive index equal to or more than 1.4.

If window wafer 602 consists or includes an oxide glass, ceramic, or other similar dielectric material, transparent adhesive 604 may be replaced by an oxide, a glass, or other suitable dielectric bonding layer applied to the roughened surface of device wafer 220. In one or more embodiments, the bonding layer may be silicon dioxide or silicon oxynitride. In one or more embodiments, the bonding layer may be any transparent bonding material disclosed in U.S. patent application Ser. No. 12/561,342, filed on Sep. 17, 2009, such as aluminum oxide, antimony oxide, arsenic oxide, bismuth oxide, boron oxide, lead bromide, lead chloride, lead oxide, lithium oxide, phosphorus oxide, potassium fluoride, potassium oxide, silicon oxide, sodium oxide, tellurium oxide, thallium oxide, tungsten oxide, zinc fluoride, and zinc oxide. U.S. patent application Ser. No. 12/561,342 is commonly owned and incorporated herein by reference.

The bonding layer may be applied to device wafer 220 via chemical vapor deposition (CVD), plasma-enhanced CVD (PECVD), or other suitable deposition technique. The bonding layer and/or window wafer surfaces may be polished via chemical-mechanical planarization (CMP) or other suitable polishing technique. Window wafer 602 may then be bonded to device wafer 220 using direct molecular bonding, fusion bonding, or anodic bonding.

Window wafer 602 provides mechanical strength to device wafer 220 for subsequent processing. Window wafer 602 may include a wavelength converting structure for modifying the emission spectrum to provide a desired color such as amber for signal lights or multiple colors for a white light emitter. The structure may be a ceramic phosphor, a suitable transparent substrate or carrier such as a sapphire or glass layer, or a filter such as a distributed Bragg reflector. The ceramic phosphor structure is described in detail in U.S. Pat. No. 7,361,938, which is commonly assigned and incorporated herein by reference. Process 110 is followed by process 112.

Figure 7:
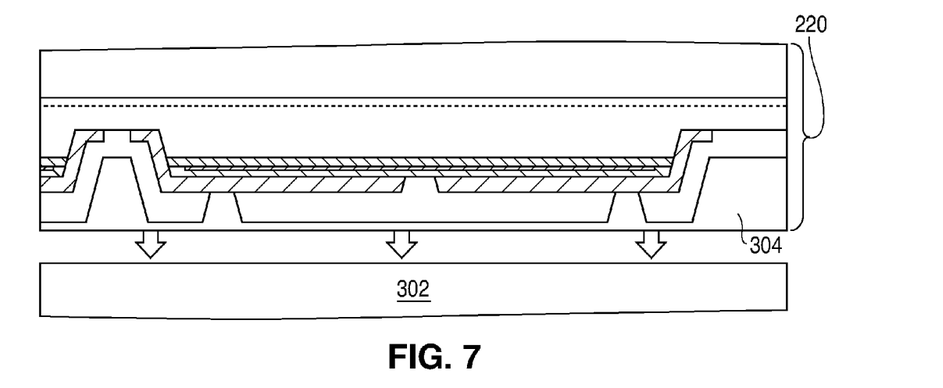

In process 112, carrier wafer 302 is removed from device wafer 220 as shown in FIG. 7. Carrier wafer 302 may be removed by applying heat to soften, by applying solvent to dissolve, or by applying light to photochemically modify the adhesive. Any remaining temporary adhesive 304 may be removed by a suitable solvent. Process 112 is followed by process 114.

Figure 8:
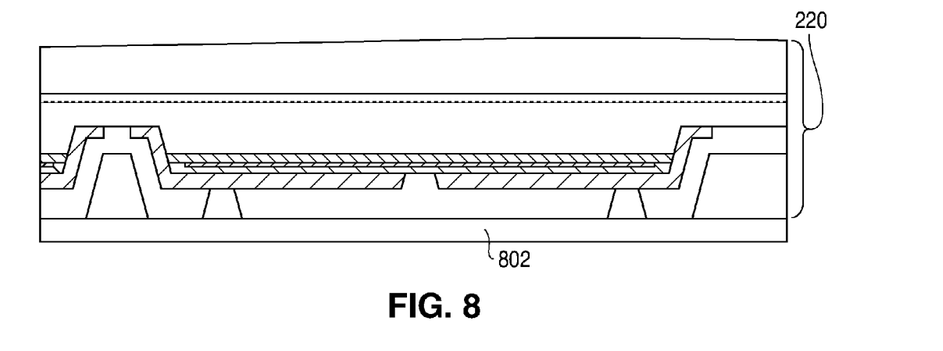

In process 114, device wafer 220 is mounted from the bottom side to a stretch film 802 as shown in FIG. 8. Stretch film 802 may be a blue tape, a white tape, a UV tape, or other suitable materials that allows adhesion to a flexible (expandable) substrate. Process 114 is followed by process 116. Stretch films are commercially available, for example, from the Furukawa Electric Co. and Semiconductor Equipment Corp.

In process 116, LED dies 200 in device wafer 220 are singulated into individual dies. LED dies 200 may be singulated using a laser, a scribe, or a saw. At this point, LED dies 200 are essentially finished devices ready for testing. However, LED dies 200 may have edge emission that degrades color-over-angle uniformity. Process 116 is followed by process 118.

Figure 9:
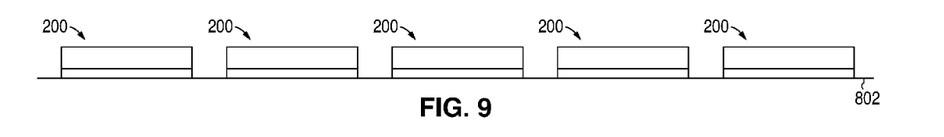

In process 118, stretch film 802 is expanded to laterally separate LED dies 200 and create the spaces between them as shown in FIG. 9. In an alternative embodiment, LED dies 200 are transferred to a rigid carrier wafer from stretch film 802. LED dies 200 may be tape transferred or picked and placed onto the rigid carrier wafer to create the spaces between the LED dies. When LED dies 200 are tape transferred, stretch film 802 is expanded to create the spaces between the LED dies before transferring the LED dies to the rigid carrier wafer. Process 118 is followed by process 120.

In process 120, a reflective coating is applied over the top of LED dies 200 and in the spaces between them. Before the reflective coating is applied, a dielectric may be deposited over the top and/or sides of LED dies 200 to increase reflectivity and/or prevent the reflective coating from shorting out the LED dies. The dielectric has antireflective properties and may be a film of, for example, silicon dioxide ($SiO_2$), magnesium fluoride ($MgF_2$), silicon nitride ($Si_3N_4$ or $SiN_x$), etc.

Figure 10:
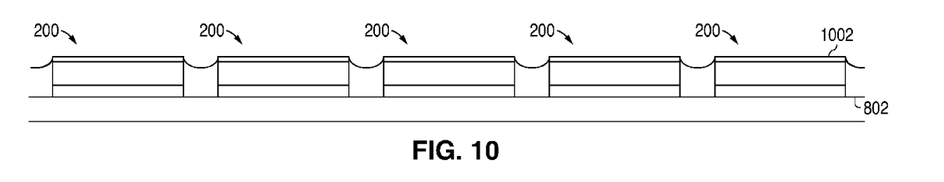
Figure 13:
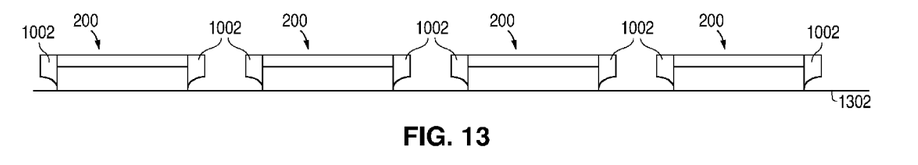
Figure 14:
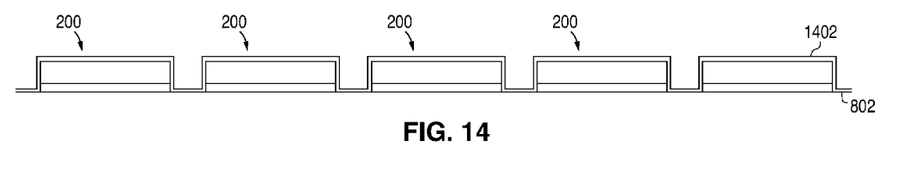
FIGS. 14 to 17 illustrate cross-sectional views of the processes in the method of FIG. 1 when the reflective coating is a thin metal film, all arranged in accordance with embodiments of the invention.

Depending on the embodiment, the reflective coating may be a polymer or a resin 1002 with reflective particles (hereafter collectively as "reflective coating 1002") as shown in FIG. 10, or a thin metal film 1402 as shown in FIG. 14. Process 120 to 130 are first described for embodiments using reflective coating 1002 with reference to FIGS. 10 to 13, and then later described for embodiments using thin metal film 1402 with reference to FIGS. 14 to 17.

Referring to FIG. 10, reflective coating 1002 may be applied over the top of LED dies 200. Concave menisci in reflective coating 1002 may form in the spaces between LED dies 200. Reflective coating 1002 may be silicone, epoxy, acrylic, etc. The reflective particles in reflective coating 1002 may be titanium oxide, zinc oxide, silica, alumina, or zirconia. Reflective coating 1002 may be applied by a sol-gel process, a wipe-on process, or a spin-on process.

Alternatively reflective coating 1002 may be applied only in the spaces between LED dies 200 using a molding process. In the molding process, LED dies 200 are placed in a mold where mold halves rest against the top and the bottom of the LED dies leaving only the spaces between the LED dies as passages for the reflective coating material. The reflective coating material is then introduced into the mold and forced through the spaces between LED dies 200. Process 120 is followed by process 122.

In process 122, reflective coating 1002 in the spaces between LED dies 200 (with or without the dielectric coating for increasing reflectivity and/or short prevention) is optionally broken or weakened (e.g., cleaved). Reflective coating 1002 in the spaces between LED dies 200 may be broken or weakened by a laser, a scribe, or a saw. If reflective coating 1002 is brittle, a bar breaking process may be used where LED dies 200 are passed over a rounded bar to break or weaken the reflective coating in the spaces between the LED dies. Reflective coating 1002 may not need to be broken or weakened if concave menisci that weaken reflective coating 1002 are automatically formed in the spaces between LED dies 200. Process 122 is followed by process 124.

Figure 11:
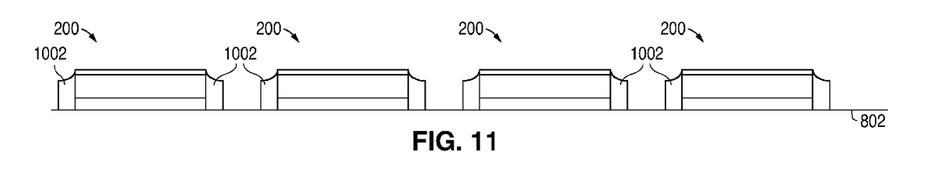

In process 124, stretch film 802 is expanded again to further laterally separate LED dies 200 as shown in FIG. 11. This step is not performed in the alternative embodiment of process 118 using a rigid carrier wafer. Process 124 is followed by process 126.

Figure 12:
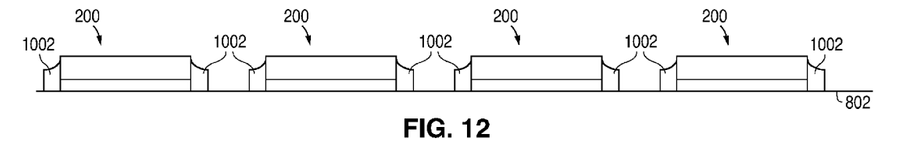

In process 126, any portions of reflective coating 1002 on the top of LED dies 200 may be removed as shown in FIG. 12. Afterwards only portions of reflective coating 1002 on the lateral sides of LED devices 200 remain. Portions of reflective coating 1002 on the lateral sides of LED dies 200 may control edge emission, improve color-over-angle uniformity, and improve brightness. Portions of reflective coating 1002 on the top of LED dies 200 may be removed by a lift-off process, etching, laser ablation, or abrasive grit blasting. The sacrificial layer for the lift-off process may be deposited in process 120 before reflective coating 1002 is formed over LED dies 200. Process 126 is followed by process 128.

In process 128, LED dies 200 are flipped over and transferred to another stretch film 1302 as shown in FIG. 13. LED dies 200 are mounted from the bottom side to stretch film 1302 and then stretch film 802 is removed so n-type bond pads 216 and p-type bond pads 218 (not shown in FIG. 13) of the LED dies are exposed on the top side for testing. It may be possible to test LED dies 200 without transferring them to a second stretch film 1302 if bond pads 216 and 218 are accessible through the first stretch film 802. Process 128 is followed by process 130.

In process 130, the individual LED dies 200 may be tested while they are affixed on stretch film 1302.

Process 120 to 130 are now described for embodiments using thin metal film 1402 with reference to FIGS. 14 to 17.

Referring to FIG. 14, thin metal film 1402 is formed over the top and sides of LED dies 200 and in the spaces between them. Thin metal film 1402 may be any reflective metal or alloy such as aluminum (Al), silver (Ag), chromium (Cr), gold (Au), nickel (Ni), vanadium (V), platinum (Pt), palladium (Pd), etc and combination thereof. Thin metal film 1402 may be formed by evaporation or sputtering. Process 120 is followed by process 122.

In process 122, thin metal film 1402 in the spaces between LED dies 200 is optionally broken or weakened (e.g., cleaved). Reflective coating 1402 in the spaces between LED dies 200 may be broken or weakened by a laser, a scribe, or a saw. If reflective coating 1402 is brittle, a bar breaking process may be used where LED dies 200 are passed over a rounded bar to physically break or weaken the reflective coating in the spaces between the LED dies. In the alternative embodiment of process 118 using a rigid carrier wafer, thin metal film 1402 in the spaces between LED dies 200 may be etched. Process 122 is followed by process 124.

Figure 15:
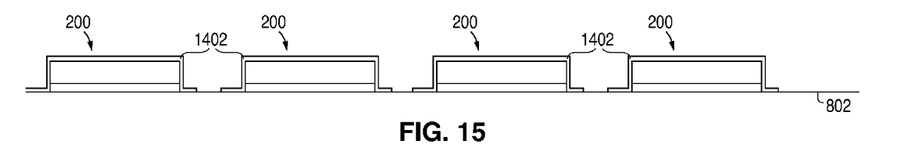

In process 124, stretch film 802 is expanded again to further laterally separate LED dies 200 as shown in FIG. 15. This step is not performed in the alternative embodiment of process 118 using a rigid carrier wafer. Process 124 is followed by process 126.

Figure 16:
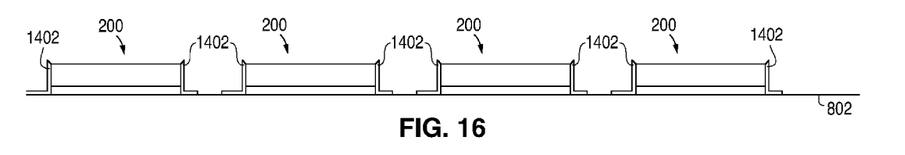

In process 126, portions of thin metal film 1402 on the top of LED dies 200 are removed as shown in FIG. 16. Afterwards only portions of thin metal film 1402 on the lateral sides of LED devices 200 remain. Thin metal film 1402 on the lateral sides of LED dies 200 may control edge emission, improve color-over-angle uniformity, and improve brightness. Portions of thin metal film 1402 on the top of LED dies 200 may be removed by a lift-off process, etching, laser ablation, or abrasive grit blasting. The sacrificial layer for the lift-off process may be deposited in process 120 before reflective coating 1402 is formed over LED dies 200. In the alternative embodiment of process 118 using a rigid carrier wafer, processes 122 and 126 may be combined in a single etch. Process 126 is followed by process 128.

Figure 17:
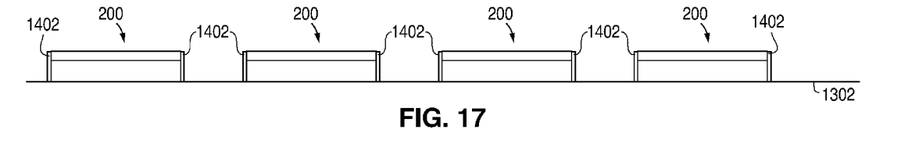

In process 128, LED dies 200 are flipped over and transferred to another stretch film 1302 as shown in FIG. 17. LED dies 200 are mounted from the bottom side to stretch film 1302 and then stretch film 802 is removed so n-type bond pads 216 and p-type bond pads 218 (not shown in FIG. 17) of the LED dies are exposed on the top side for testing. It may be possible to test LED dies 200 without transferring them to a second stretch film 1302 if bond pads 216 and 218 are accessible through the first stretch film 802. Process 128 is followed by process 130.

In process 130, the individual LED dies 200 may be tested while they are affixed on stretch film 1302. Various other adaptations and combinations of features of the embodiments disclosed are within the scope of the invention. For example, when the reflective coating is a polymeric resin loaded with reflective particles, a very thin layer may be left on the top of LED dies 200 to serve as an optical diffuser or to make the top of the dies appear the same color as the reflective particles (e.g., white). Numerous embodiments are encompassed by the following claims.

What is claimed is:

1. A method for wafer scale fabrication of light emitting diode (LED) dies, comprising:
   forming LED devices over a growth wafer to form the device wafer, the LED devices comprising a n-type layer over the growth wafer, a light-emitting layer over the n-type layer, and a p-type layer over the light-emitting layer;
   bonding a carrier wafer to a p-side of the device wafer, the p-side of the device wafer being a side that is closer to the p-type layer than the n-type layer;
   removing the growth wafer from a n-side of the device wafer, the n-side of the device wafer being a side that is closer to the n-type layer than the p-type layer;
   bonding a window wafer to the n-side of the device wafer;
   removing the carrier wafer from the p-side of the device wafer singulating the device wafer into LED dies;
   separating the LED dies to create spaces between the LED dies;
   applying a reflective coating in the spaces between the LED dies; and
   breaking or separating the reflective coating in the spaces between the LED dies,
   wherein portions of the reflective coating remain on the lateral sides of the LED dies to control edge emission.

2. The method of claim 1, wherein:
   bonding the carrier wafer comprises using a heat, solvent, or light-exposure release adhesive to bond the carrier wafer to the p-side of the device wafer; and
   removing the carrier wafer comprises applying heat, solvent, or light to release the carrier wafer from the device wafer.

3. The method of claim 1, wherein removing the growth wafer comprises using laser lift-off to release the growth wafer from the device wafer.

4. The method of claim 1, further comprising roughening the n-type layer prior to bonding the window wafer to the n-side of the device wafer.

5. The method of claim 1, wherein bonding the window wafer to the n-side of the device wafer comprises applying a silicone or epoxy to the n-side of the device wafer to bond the window wafer to the n-side of the device wafer.

6. The method of claim 1, wherein bonding the window wafer to the n-side of the device wafer comprises using direct molecular, fusion, or anodic bonding.

7. The method of claim 6, further comprising forming an oxide or a glass layer on the n-side of the device wafer prior to bonding the window wafer to the n-side of the device wafer.

8. The method of claim 1, wherein the LED devices further comprise bond pads over the p-type layer, each bond pad being electrically coupled to the n-type layer or the p-type layer.

9. The method of claim 1, wherein the reflective coating is a polymer or a resin with reflective particles.

10. The method of claim 9, wherein the reflective coating is silicone, epoxy, or acrylic, and the reflective particles are titanium oxide, zinc oxide, silica, alumina, or zirconia.

11. The method of claim 9, wherein applying the reflective coating in the spaces between the LED dies comprises applying the reflective coating in a sol-gel process, a wipe-on process, a spin-on process, or a molding process.

12. The method of claim 1, wherein the reflective coating is a thin metal film.

13. The method of claim 12, wherein the reflective coating is aluminum, silver, chromium, gold, nickel, vanadium, platinum, palladium, or a combination thereof.

14. The method of claim 12, wherein applying the reflective coating in the spaces between the LED dies comprises applying the reflective coating by evaporation or sputtering.

15. The method of claim 1, further comprising:
prior to singulating the LED dies in the device wafer, mounting the device wafer with the LED dies to a stretch film;
wherein separating the LED dies comprises transferring the LED dies from the stretch film to a carrier wafer to create the spaces between the LED dies.

16. The method of claim 1, further comprising:
prior to singulating the LED dies in the device wafer, mounting the device wafer with the LED dies to a stretch film;
wherein separating the LED dies comprises expanding the stretch film to laterally separate the LED dies prior to applying the reflective coating over the LED dies and in the spaces between the LED dies.

17. The method of claim 16, wherein the breaking or separating the reflective coating in the spaces between the LED dies comprises:
weakening or breaking the reflective coating in the spaces between the LED dies; and
further expanding the stretch film to further separate the LED dies.

18. The method of claim 16, further comprising, removing any reflective coating from the top of the LED dies.

19. The method of claim 18, wherein removing the reflective coating from the top of the LED dies comprises a lift-off process, etching, laser ablation, or grit-blasting.

20. The method of claim 18, further comprising: mounting the LED dies to another stretch film from the other side of the LED dies; and
removing the stretch film from the LED dies.

21. The method of claim 20, further comprising, testing the LED dies after mounting the LED dies to the other stretch film from the other side of the LED dies.

* * * * *